United States Patent [19]

Landis

[11] Patent Number: 4,816,967

[45] Date of Patent: Mar. 28, 1989

[54] LOW IMPEDANCE INTERCONNECT METHOD AND STRUCTURE FOR HIGH FREQUENCY IC SUCH AS GAAS

[75] Inventor: Richard C. Landis, Orlando, Fla.

[73] Assignee: ITT Gallium Arsenide Technology Center A Division of ITT Corporation, Roanoke, Va.

[21] Appl. No.: 117,372

[22] Filed: Oct. 28, 1987

Related U.S. Application Data

[63] Continuation of Ser. No. 905,375, Sep. 5, 1986, abandoned, Continuation of Ser. No. 671,347, Nov. 14, 1984, abandoned.

[51] Int. Cl.[4] .............................................. H05K 7/02
[52] U.S. Cl. ................................ 361/401; 174/35 R; 174/36; 174/51; 174/52.1
[58] Field of Search ............... 174/35 R, 36, 51, 52 R; 361/401, 407

[56] References Cited

U.S. PATENT DOCUMENTS

| | | | |
|---|---|---|---|
| 1,880,352 | 10/1932 | McMurtrie | 174/51 X |
| 3,155,881 | 11/1964 | Jean | 317/401 |
| 3,324,224 | 6/1967 | Thibodeau | 174/35 R |
| 3,407,261 | 10/1968 | Donath et al. | 361/424 X |
| 3,533,023 | 10/1970 | Friend et al. | 361/401 X |
| 3,792,383 | 2/1974 | Knappenberger | 361/401 X |
| 3,806,767 | 4/1974 | Lehrfeld | 361/424 X |
| 3,816,911 | 6/1974 | Knappenberger II | 29/626 X |
| 3,927,249 | 12/1975 | Pearse | 174/51 |
| 4,015,070 | 3/1977 | Theurer | 174/52 R X |
| 4,153,988 | 5/1979 | Doo | 361/401 X |
| 4,455,448 | 6/1984 | Bertolina | 174/35 R |
| 4,468,535 | 8/1984 | Law | 174/65 R |
| 4,487,999 | 12/1984 | Baird et al. | 174/52 S |
| 4,494,095 | 1/1985 | Noji et al. | 361/424 X |
| 4,514,785 | 4/1985 | Parmentier | 361/401 |
| 4,747,019 | 5/1988 | Ito et al. | 174/35 R X |

Primary Examiner—R. R. Kucia
Attorney, Agent, or Firm—Robert A. Walsh; Thomas N. Twomey; Mary C. Werner

[57] ABSTRACT

A method and structure are disclosed for mounting and connecting an electronic device such as an integrated circuit to a circuit board. The board has a plurality of embedded shielded conductors for interconnecting the integrated circuit to other devices on the board. In order to limit the capacitance and inductance of the connection, the integrated circuit is mass bonded directly to the conductors and to their coaxial shields.

3 Claims, 4 Drawing Sheets

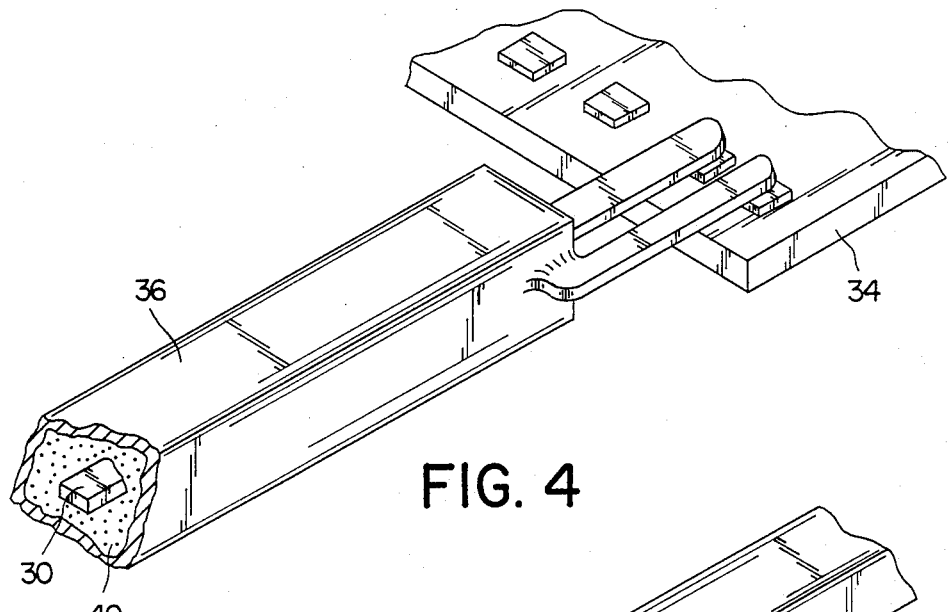
FIG. 4
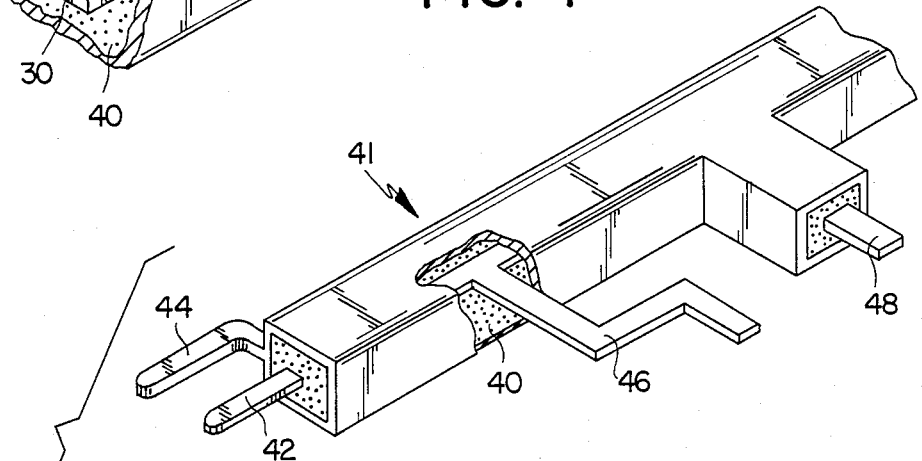
FIG. 5
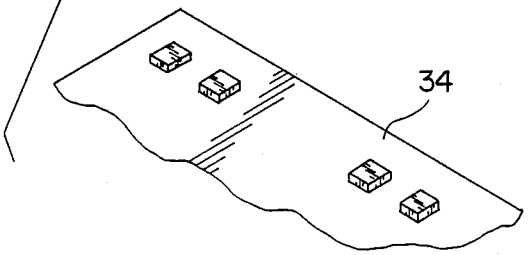

LOW IMPEDANCE INTERCONNECT METHOD AND STRUCTURE FOR HIGH FREQUENCY IC SUCH AS GAAS

This is a continuation, of application Ser. No. 905,375 filed Sept. 5, 1986 which is a continuation of application Ser. No. 671,347 filed Nov. 14, 1984, both now abandoned.

BACKGROUND OF THE INVENTION

1. Field of Invention

This invention pertains to a method structure for interconnecting high frequency integrated circuits and more particularly to a method of connecting an integrated circuit to a micro-coaxial substrate.

2. Description of the Prior Art

Conventionally, various integrated circuits disposed on a common circuit board are interconnected by conductive strips which are etched or otherwise deposited on the board. An individual connection is made between each IC terminal and a corresponding strip by wire bonding. A typical example of wire bonding between integrated circuits is shown in U.S. Pat. No. 4,172,261. However it was found that this type of connection is not suitable for high frequency integrated circuits because the wires used in wire bonding have a high parasitic capacitance and inductance and therefore present a high impedance to the signals exchanged between the integrated circuits. One proposed solution was to use optical fibers as the transmission means between integrated circuits. However this approach has two major disadvantages: first the electrical signals must be converted into optical signals, and then back to electrical signals, thus requiring additional components. Second, optical fibers musts be aligned very carefully with the optical signal transmitters or receivers to insure maximum signal transfer therebetween.

One solution which alleviates the problem of high impedance is to provide a coaxial conductor between the IC's. For example, as disclosed in my copending application S.N. 671,276 filed November 14, 1984 entitled Micro-Coaxial Substrate a substrate could be provided which has a plurality of shielded conductors with connecting tabs disposed adjacent to the respective IC's. However if the IC's are connected to the shielded conductors by wire bonding, the unshielded wires of the bond are still long enough to provide an undesirably high impedance. Furthermore these wire bonds are normally made by hand and therefore are expensive, time consuming and unreliable.

OBJECTIVES AND SUMMARY OF THE INVENTION

In view of the above-described disadvantages in the prior art, a principal objective of the present invention is to provide a method of connecting an IC to a coaxial conductor imbedded in a substrate in which the length of the connecting unshielded conductor is minimized to reduce its high frequency impedance.

A further objective is to provide a method in which all the connections to an IC are made simultaneously.

Yet another objective is to provide a method for interconnecting high frequency IC's such as GaAs suitable for high speed automation.

Other objective and advantages of the invention shall become apparent from the following description of the invention.

According to the present invention, a board for high speed integrated circuits comprises a layer of insulated material having a plurality of embedded shielded conductors terminated with exposed connecting pads. Each integrated circuit is provided with a plurality of metal bumps plated to the integrated circuits, one for each interconnection. The bumped integrated circuits are then compression bonded to the connecting pads of the embedded shielded conductors using automatic equipment.

BRIEF DESCRIPTION OF THE FIGURES

FIG. 3b shows an end view of the shielded conductor of FIG. 3a;

FIGS. 4 and 5 show enlarged view of a shielded conductor being connected to an integrated circuit;

DETAILED DESCRIPTION OF THE INVENTION

Figure 1:
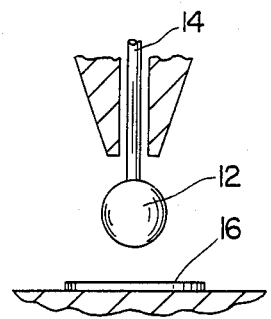
FIG. 1 illustrates wire bonding to an integrated circuit.

Typically, integrated circuits are interconnected by wiring bonding. As shown in FIG. 1, wire bonding involves forming a ball of molten metal 12 on the end of a wire 14 and then applying the ball and wire to a bonding pad 16. The pad is usually an aluminum metalized area on the surface of an integrated circuit board. However, as previously mentioned, at high frequencies this type of interconnecting is undesirable because of its high inductance and capacitance as well as cross-coupling.

Figure 2:
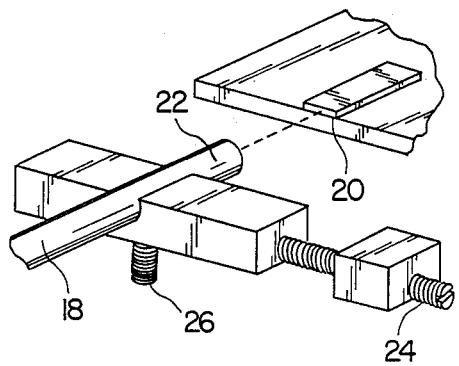
FIG. 2 illustrates a high frequency connection using optical fibers.

An alternate method, illustrated in FIG. 2, comprises the use of an optical fiber 18. Signals are passed to or from the fiber through an appropriate opto-electronic device 20 which may be a phototransistor (for receiving signals) or an LED or laser diode (for transmitting). However this interconnection requires a precise alignment. More particularly end 22 of fiber 18 must be positioned and oriented in a preselected spacial relationship with respect to device 20 by turning adjusting screws 24 and 26 or other mechanical means for alignment. These adjustments require great dexterity on the part of the personnel making the installation. Furthermore, very slight angular misalignments are deleterious to signal strength and the whole process is expensive and time consuming. Obviously this interconnection method is not suitable for automation.

Figure 3A:
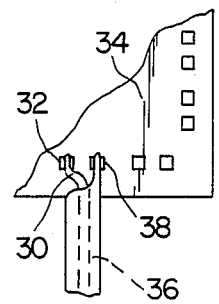
FIG. 3a shows a plan view of an connection between a shielded conductor and an integrated circuit.
Figure 3B:
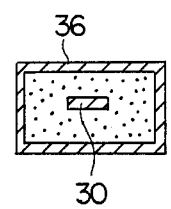

For the reasons outlined above it would be very advantageous to have a miniaturized shielded conductor arranged and constructed so that, as shown in FIGS. 3a and 3b, the conductor 30 could be electrically connected to one of the pads 32 of an I.C. 34 while its shield 36 could be connected to another pad 38, of the I.C., which may comprise, for example, the ground terminal of the I.C.

As shown in more detail in FIG. 4, the shield 36 is preferably coaxial around conductor 30. A dielectric material 40 is provided within the shield to support and insulate conductor 30. This type of connection is advantageous over the prior art connections in that the actual conductor can be made relatively short and the shield reduces its parasitic capacitance, and cross-coupling.

Furthermore, as shown in FIG. 5, a shielded conductor 41 may be provided with a pair of terminals 42 and 44 and several other branches such as 46 and 48 electrically connected to the conductor and designed in different shapes as required for intermediate connections to other devices.

If the shielded conductors such as the ones shown in FIGS. 4 and 5 are to be made very thin they may not be self supporting and could be rather difficult to handle. However these problems can be obviated when these shielded conductors are embedded in the substrate of the circuit board, used to support the different electronic devices. For example, as disclosed in my above-mentioned copending application and incorporated herein by reference a circuit board is formed by super-imposing successive substrate layers. Portions of the layers comprise conductive strips which are arranged and constructed so that a preselected pattern of shielded conductors is formed in the board. This configuration is particularly suitable for interconnecting electronic devices by using shielded coaxial conductors. Furthermore the configuration may also be used for automatic installation of integrated circuits on circuit boards as shall be described below.

The preferred embodiment of this invention is the thermal-compression bonding of one or more chips directly to conductors embedded in the circuit substrate.

Figure 6:
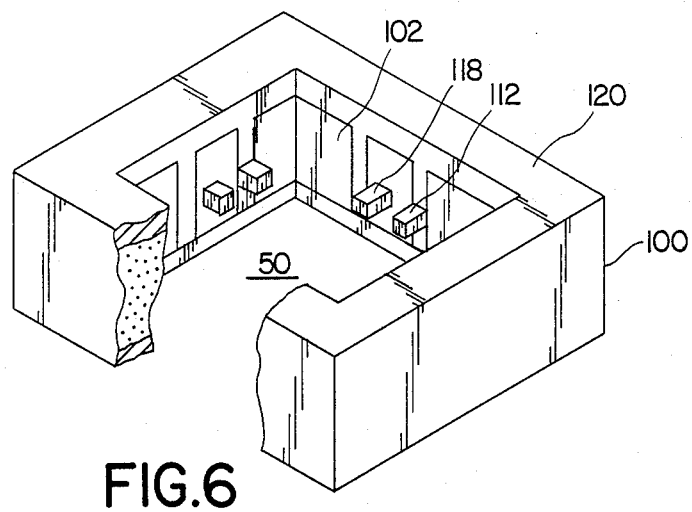
FIG. 6 shows a circuit board prepared for an embedded integrated circuit.
Figure 7:
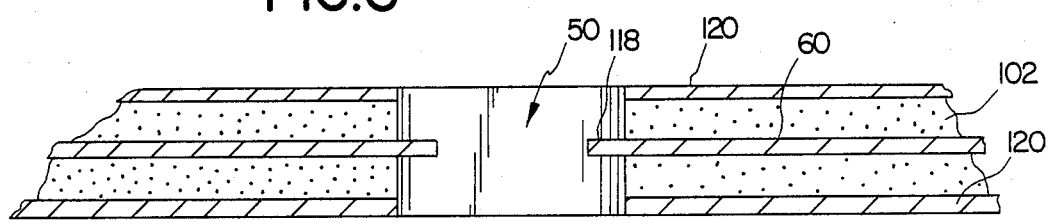
FIG. 7 shows a cross-sectional view of the circuit board prepared in accordance with FIG. 6.
Figure 8:
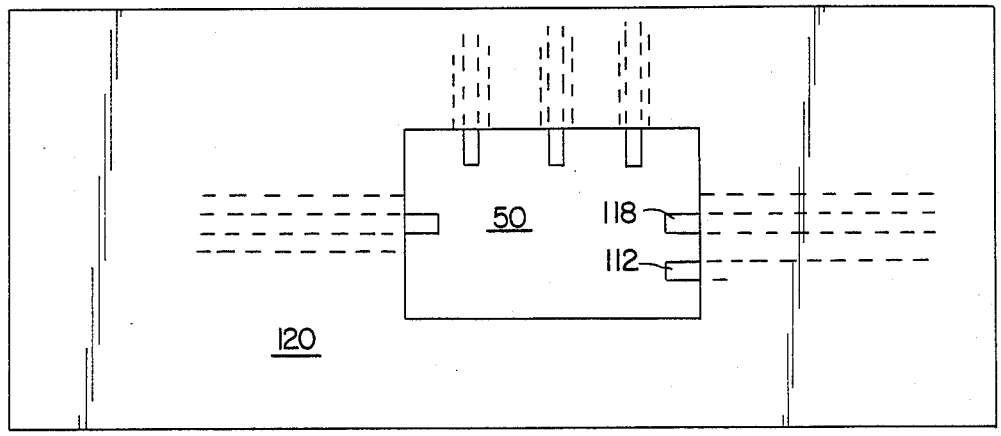
FIG. 8 shows a plan view of the board of FIG. 7.

The printed circuit substrate conductors and shields are fabricated according to a method described in my above-mentioned copending application. In addition, a cavity 50 is created in the substrate 100 to expose a portion of conductor 60 to form a connecting pad 118 and to expose tab 112 connected to corresponding shield 120 (see FIGS. 6-8). The conductor 60 is supported by and completely isolated from the shield 120 by a dielectric material 102. The dielectric material has been completely removed from the cavity area 50. FIG. 7 shows the resulting cross-sectional view of the cavity 50 and exposed connecting pad 118 suspended by dielectric 102.

The bonding is accomplished in an automated manner similar to a method commonly referred to as tape automated bonding (TAB). A full description of this method for bonding unshielded conductors on the surface of a flexible tape may be found in the Oct. 20, 1974 issue of EDN in the article entitled "Tape-Carrier Packaging Boasts Almost Unlimited Potential", by Walt Palstone. In the present invention the single layer TAB tape has been replaced by a multi-layer substrate having buried conductors completely shielded and designed in a fashion described in aforementioned copending application.

The semiconductor IC is then TAB bonded to the internal buried conductors.

Figure 9:
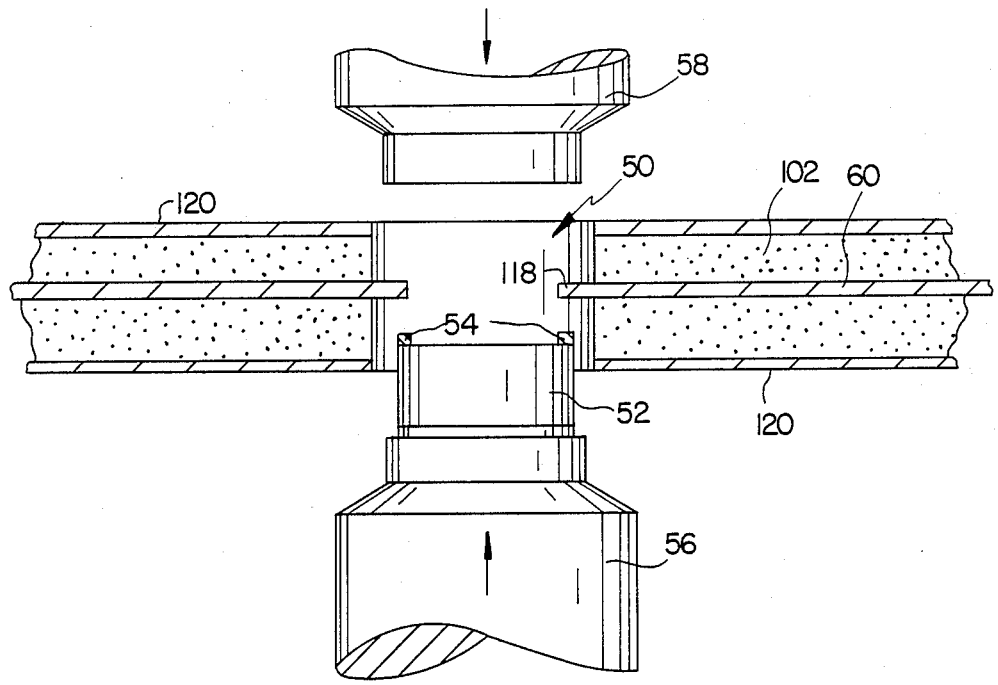
FIG. 9 shows a bumped chip positioned for compression bonding to embedded conductors in the board of FIG. 8.

In FIG. 9, a semiconductor chip 52 having a plurality of connecting bumps 54 plated onto the IC bonding pad sites is supported on a lower bond tool 56. The bond tool 56 is accurately aligned such that the connecting bumps fall directly under the connecting pads 118 and shield tabs 112. An upper bond tool 58 then comes down into cavity 50 to apply heat and pressure to a plurality of connecting pads 118 and shield tabs 112 each aligned with an associated connecting bump 54 on IC 52. The heat and pressure thus applied effects a mass bonding of all conductors and shields at the same time. Such as simultaneous mass bonding is highly suited for automatic assembly.

Figure 10:
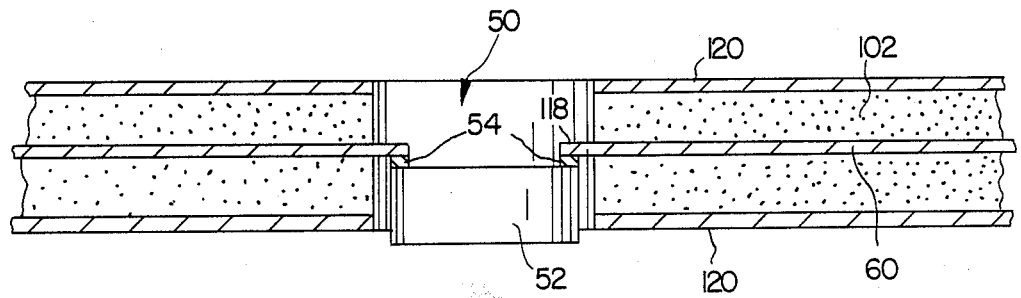
FIG. 10 shows a completed IC chip after thermal compression bonding to conductors embedded in the circuit board.

In FIG. 10, the resulting TAB bonded IC 52 is shown completely attached to the buried and shielded conductor 60. IC 52 itself is likewise embedded in the multi-layer substrate. Of course the thickness of the IC could vary so that it may extend beyond the surface of the substrate.

Figure 11:
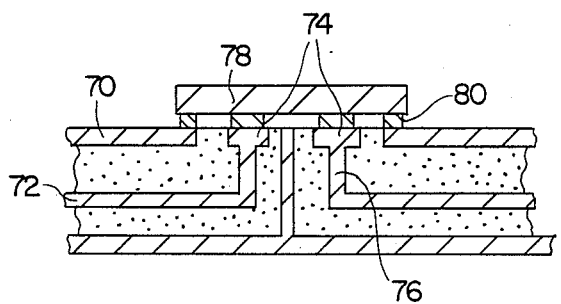
FIG. 11 shows an alternate embodiment of the invention.

An alternate embodiment is shown in FIG. 11. In this embodiment substrate 70 is formed with one or more shielded conductors 72. Insulated pads 74 are formed on the surface of the substrate and connected to conductors 72 by vertical portions 76 as shown. The top or outer surface of pads 74 is substantially coplanar or flush with the outer surface of the substrate.

An integrated circuit or chip 78 for mounting on the substrate is provided with connected bumps 80 plated on the circuit connecting pads. The chip is then connected to the substrate by compression bonding as described above. As shown in FIG. 11, some of the bumps 80 are bonded to conductor 74 while other bumps are bonded directly to the conductor shields.

Obviously one skilled in the art could perform various modification to the embodiments presented above without departing from the scope of the invention as set forth in the appended claims.

I claim:

1. A substrate for receiving a semiconductor chip having a plurality of pad sites, said substrate comprises:
   a conductor;
   a layer of dielectric material coaxially surrounding said conductor;
   a shield coaxially surrounding said dielectric material; said dielectric material and said shield having a cavity extending therethrough in order to permit a semiconductor chip to be received therein;
   a conductor termination, said conductor termination being an extension of said conductor and protruding into said cavity for directly contacting one of the pad sites of the chip; and
   a shield termination, said shield termination being an extension of said shield and protruding into said cavity for directly contacting another of the pad sites of the chip.

2. The substrate of claim 1 wherein said conductor and shield terminations comprise pads for compression bonding to said device.

3. The substrate of claim 2 wherein said conductor and shield terminations are axially aligned with the respective pad sites.

* * * * *